United States Patent
Afzal et al.

(10) Patent No.: US 11,868,867 B1
(45) Date of Patent: Jan. 9, 2024

(54) DECOMPRESSION AND COMPRESSION OF NEURAL NETWORK DATA USING DIFFERENT COMPRESSION SCHEMES

(71) Applicant: Amazon Technologies, Inc., Seattle, WA (US)

(72) Inventors: Tariq Afzal, San Jose, CA (US); Arvind Mandhani, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/989,340

(22) Filed: Nov. 17, 2022

Related U.S. Application Data

(63) Continuation of application No. 16/455,258, filed on Jun. 27, 2019, now Pat. No. 11,537,853.

(Continued)

(51) Int. Cl.
| | | |
|---|---|---|
| *G06N 3/04* | (2023.01) | |
| *H03M 7/30* | (2006.01) | |
| *G06N 5/04* | (2023.01) | |
| *H03M 7/42* | (2006.01) | |
| *G06N 3/048* | (2023.01) | |

(52) U.S. Cl.
CPC ............. *G06N 3/048* (2023.01); *G06N 5/04* (2013.01); *H03M 7/42* (2013.01); *H03M 7/702* (2013.01)

(58) Field of Classification Search
CPC ........ G06N 3/0481; G06N 5/04; G06N 3/048; G06N 3/10; H03M 7/42; H03M 7/702; G10L 15/05; G10L 15/02; G10L 15/14; G10L 15/1822; G10L 15/19; G10L 25/87; G10L 15/01; G10L 15/083; G10L 15/16; G10L 15/18; G10L 15/193;

(Continued)

(56) References Cited

U.S. PATENT DOCUMENTS

| | | |
|---|---|---|
| 7,389,407 B1 | 6/2008 | Kuslak et al. |
| 9,836,691 B1 | 12/2017 | Narayanaswami et al. |

(Continued)

OTHER PUBLICATIONS

U.S. Appl. No. 16/455,258, "Notice of Allowance," dated Aug. 24, 2022, 12 pages.

(Continued)

*Primary Examiner* — Khai M Nguyen
(74) *Attorney, Agent, or Firm* — Kilpatrick Townsend & Stockton LLP

(57) ABSTRACT

Described herein is a neural network accelerator (NNA) with a decompression unit that can be configured to perform multiple types of decompression. The decompression may include a separate subunit for each decompression type. The subunits can be coupled to form a pipeline in which partially decompressed results generated by one subunit are input for further decompression by another subunit. Depending on which types of compression were applied to incoming data, any number of the subunits may be used to produce a decompressed output. In some embodiments, the decompression unit is configured to decompress data that has been compressed using a zero value compression scheme, a shared value compression scheme, or both. The NNA can also include a compression unit implemented in a manner similar to that of the decompression unit.

20 Claims, 9 Drawing Sheets

Related U.S. Application Data

(60) Provisional application No. 62/772,359, filed on Nov. 28, 2018.

(58) Field of Classification Search
CPC ... G10L 2025/783; G06F 5/01; G06F 7/5443; G06F 7/57; G06F 17/16; G06F 40/289
See application file for complete search history.

(56) References Cited

U.S. PATENT DOCUMENTS

| | | | |
|---|---|---|---|
| 10,585,973 | B2 | 3/2020 | Tao et al. |
| 10,643,129 | B2 | 5/2020 | Chen et al. |
| 10,659,534 | B1 | 5/2020 | Mckown |
| 11,056,098 | B1 | 7/2021 | Gejji |
| 11,520,561 | B1 | 12/2022 | Afzal |
| 2002/0073301 | A1 | 6/2002 | Kahle et al. |
| 2009/0259826 | A1 | 10/2009 | Moore |
| 2014/0173261 | A1 | 6/2014 | Garza et al. |
| 2015/0052339 | A1 | 2/2015 | Suzuki |
| 2016/0041851 | A1 | 2/2016 | Bauerle et al. |
| 2017/0270996 | A1 | 9/2017 | Takasugi |
| 2018/0046900 | A1* | 2/2018 | Dally .................. G06F 9/30018 |
| 2018/0113708 | A1 | 4/2018 | Corbal et al. |
| 2018/0143835 | A1 | 5/2018 | Whittaker |
| 2018/0225116 | A1 | 8/2018 | Henry et al. |
| 2018/0307976 | A1 | 10/2018 | Fang et al. |
| 2018/0315399 | A1* | 11/2018 | Kaul ....................... G06F 7/483 |
| 2018/0341484 | A1 | 11/2018 | Fowers et al. |
| 2019/0026250 | A1 | 1/2019 | Das Sarma et al. |
| 2019/0065192 | A1 | 2/2019 | Tao et al. |
| 2019/0250915 | A1 | 8/2019 | Yadavalli |
| 2019/0303749 | A1 | 10/2019 | Appuswamy et al. |
| 2020/0050918 | A1 | 2/2020 | Chen et al. |
| 2020/0134459 | A1 | 4/2020 | Zeng et al. |
| 2020/0160222 | A1 | 5/2020 | Zhang et al. |
| 2021/0150685 | A1 | 5/2021 | Chen et al. |

OTHER PUBLICATIONS

Afzal et al., U.S. Appl. No. 16/455,334, "Neural Network Accelerator With Reconfigurable Memory," Jun. 27, 2019, 39 pages.

Afzal, U.S. Appl. No. 16/455,551, "Neural Network Accelerator With Compact Instruct Set," Jun. 27, 2019, 55 pages.

Chen et al., "A Flexible and Energy-Efficient Convolutional Neural Network Acceleration With Dedicated ISA and Accelerator", In IEEE Transactions on Very Large Scale Integration (VLSI) Systems, vol. 26, No. 7, Jul. 2018, pp. 1408-1412.

Liu et al., "Cambricon: an Instruction Set Architecture for Neural Networks", 2016 ACM/IEEE 43rd Annual International Symposium on Computer Architecture (ISCA), Jun. 2016, pp. 393-405.

Gejji, U.S. Appl. No. 16/455,400, "Hybrid Decoding Using Hardware and Software for Automatic Speech Recognition Systems," filed Jun. 27, 2019.

Gejji, U.S. Appl. No. 17/328,114, "Silent Phonemes for Tracking End of Speech," filed May 24, 2021.

Gejji, U.S. Appl. No. 17/401,141, "Hybrid Decoding Using Hardware and Software for Automatic Speech Recognition Systems," filed Aug. 12, 2021.

Gong et al., "MALOC: a Fully Pipelined FPGA Accelerator for Convolutional Neural Networks With All Layers Mapped on Chip," IEEE Transactions on Computer-Aided Design of Integrated Circuits and Systems, vol. 37, Issue 11, Jul. 18, 2018, pp. 2601-2612.

Hanif et al., "MPNA: a Massively-Parallel Neural Array Accelerator with Dataflow Optimization for Convolutional Neural Networks," arXiv preprint arXiv:1810.12910, Oct. 30, 2018,.

Hwang et al., "An Efficient FPGA-based Architecture for Convolutional Neural Networks," 40th International Conference on Telecommunications and Signal Processing (TSP), 2017.

Lin et al., "Data and Hardware Efficient Design for Convolutional Neural Network," IEEE Transactions on Circuits and Systems, vol. 65, Issue 5, 2017, pp. 1642-1651.

Zhang et al., "Caffeine: Toward Uniformed Representation and Acceleration for Deep Convolutional Neural Networks," IEEE Transactions on Computer-Aided Design of Integrated Circuits and Systems, vol. 38, Issue 11, Oct. 18, 2018, pp. 2072-2085.

* cited by examiner

DECOMPRESSION AND COMPRESSION OF NEURAL NETWORK DATA USING DIFFERENT COMPRESSION SCHEMES

CROSS-REFERENCES TO RELATED APPLICATIONS

This application claims the benefit of and is a continuation of U.S. Non-Provisional application Ser. No. 16/455,258, filed Jun. 27, 2019, and entitled "DECOMPRESSION AND COMPRESSION OF NEURAL NETWORK DATA USING DIFFERENT COMPRESSION SCHEMES," which claims the benefit of and priority to U.S. Provisional Application No. 62/772,359 filed Nov. 28, 2018, entitled "ACE Architecture— NNA." The contents of U.S. Non-Provisional application Ser. No. 16/455,258 and U.S. Provisional Application No. 62/772,359 and incorporated herein in their entirety for all purposes. The entire contents of the following applications, filed concurrently with the parent application, are also incorporated herein by reference for all purposes:

(1) U.S. Non-Provisional application Ser. No. 16/455,334, filed Jun. 27, 2019, titled "NEURAL NETWORK ACCELERATOR WITH RECONFIGURABLE MEMORY"; and
(2) U.S. Non-Provisional application Ser. No. 16/455,551, filed Jun. 27, 2019, titled "NEURAL NETWORK ACCELERATOR WITH COMPACT INSTRUCT SET".

BACKGROUND

Neural networks are currently being developed for a wide variety of applications such as image or speech recognition. Neural networks can be executed on general purpose processors using program code written in a specialized programming language such as TensorFlow. The program code is converted into machine instructions by a compiler. In a neural network, the types of computations performed, and the data the computations are performed on, are very different from that used for other applications. For example, neural networks generally involve repeated manipulation of large quantities of data in the form of activation values and weight values. Because the amount of data is large, supplying this data to a computing system that executes a neural network requires that the computing system have a corresponding large memory in which the data can be stored, as well as sufficient bandwidth to transmit the data between components of the computing system or between the computing system and external devices. This increases the hardware requirements and power consumption of the computing system.

BRIEF DESCRIPTION OF THE DRAWINGS

Various embodiments in accordance with the present disclosure will be described with reference to the drawings, in which.

DETAILED DESCRIPTION

Figure 1:
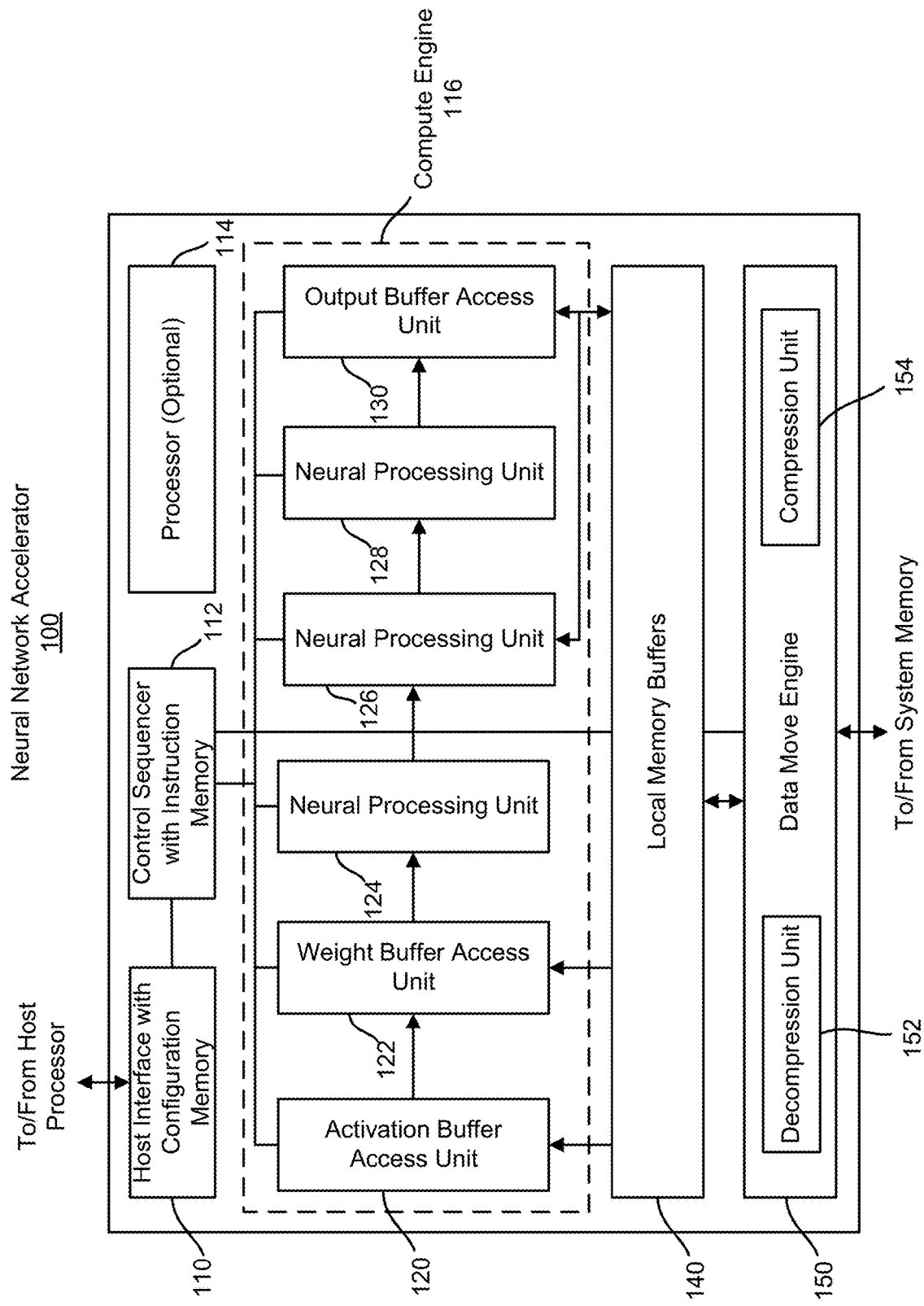
FIG. 1 is a block diagram of an example neural network accelerator, according to certain embodiments.

Embodiments are described herein for a neural network processor, also referred to as a neural network accelerator (NNA), in which the neural network processor includes a decompression pipeline for decompressing data operated on by a neural network and/or a compression pipeline for compressing data generated by the neural network. Compression may be used to reduce the amount of data, and thus the bandwidth utilized, when writing data to a memory of the NNA, e.g., data from a source location in system memory. Similarly, compression may be used to reduce the bandwidth utilized when reading data from the memory of the NNA, e.g., to a destination in system memory. In certain embodiments, the decompression or compression pipeline is implemented based on compression schemes specifically designed to take advantage of the characteristics of neural network data. For example, because neural network data often includes mainly zero values (particularly in weight values and, to a lesser extent, activation values), the data can be compressed using a zero value compression scheme to remove data values that are equal to or within a certain range of zero. Accordingly, a decompression pipeline may include a zero value decompression unit for decompressing data that has been zero value compressed. As another example, the data may be compressed using a shared value compression scheme in which data values are grouped into clusters so that the data is represented using a smaller set of values. Thus, the same decompression pipeline that include a zero value decompression unit can also include a shared value decompression unit communicatively coupled to the zero value decompression unit.

In certain embodiments, data is decompressed on-the-fly as the data is being loaded from a source memory for storage in a destination memory. For example, a data move engine can include a decompression unit that decompresses incoming data from a system memory before storing the decompressed data to a local memory buffer of the NNA. Data from the system memory can be decompressed and transferred for storage in the local memory buffer while new data is sent from the system memory, the new data also to be decompressed and stored in the local memory buffer. Thus, decompression and storage can occur concurrently. Similarly, compression of data can also be on-the-fly. Data from a source memory can be compressed for storage in a destination memory while new data is being read out of the source memory for subsequent compression. In other embodiments, a local memory buffer may store compressed data sent from a source memory, with the compressed data being decompressed prior to when the data is needed as input to a processing unit of the NNA.

Also described herein are techniques for determining the appropriate compression scheme configuration to use for compressing data for input to or output from the NNA. The compression scheme configuration may include one or more types of compression, e.g., zero value compression, shared value compression, or a combination of zero value and shared value compression. The determination of the compression scheme configuration may further include determining the value for a configurable compression parameter employed by a compression scheme. The manner in which the appropriate compression scheme configuration is determined can vary depending on whether the compression is performed offline (e.g., by a software compiler) or at runtime (e.g., by a compression unit of the NNA), or depending on the type of data to be compressed (e.g., weights versus activations). For each compression scheme selectable for inclusion the compression scheme configuration, the NNA can support a corresponding decompression scheme.

One of the advantages of having a pipeline based on multiple decompression schemes is the ability to select between using one decompression scheme by itself or using a combination of decompression schemes, based on whichever provides better performance for a particular set of data. As explained below, the performance of a compression scheme or decompression scheme can be measured in various ways. Another advantage of pipelined decompression is that when the data to be decompressed requires processing through multiple decompression units, the partially decompressed data generated by one decompression unit can be input to another decompression unit for further decompression with little or no memory overhead incurred in the transfer. Thus, decompression using a first decompression scheme can occur in-line with decompression using a second decompression scheme. Similar advantages apply to a pipeline based on multiple compression schemes.

In certain embodiments, the selection of which compression or decompression scheme to use is based on an operating mode or state of the NNA. For example, in a low power mode, more compression can be used than in a higher power mode, in order to reduce the amount of processing performed by the NNA. As another example, the NNA may be configured to operate in a high bandwidth mode and a low bandwidth mode, where the high bandwidth mode enables data to be read into or out of a memory of the NNA at a faster rate compared to the low bandwidth mode. When operating in the high bandwidth mode, data may be compressed (or compressed to a greater extent compared to the low bandwidth mode) for transfer into or out of the NNA memory.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Neural networks are modeled using one or more layers. In a simple neural network, there may be an input layer followed by a hidden layer and then an output layer. A neural network implementation can include multiple hidden layers. Each layer comprises some number of nodes, where each node represents a neuron. A node can be connected to one or more nodes of another layer. The connections represent synapses and are assigned weights. The input layer may receive inputs to the neural network and propagate the inputs to the hidden layer, which in turn performs some computation to propagate the results of the computation to the output layer. The computations are performed by nodes. The input to a node in a hidden or output layer is referred to as an input activation. The output of a node in a hidden or output layer is referred to as an output activation. The output activations of the output layer produce the final results of the neural network and correspond to inferences concerning the inputs supplied to the input layer. An example of a computation that can occur in a node is as follows:

$$y = f\left(\sum_i w_i * x + iv\right)$$

where $w_i$ is a weight, x is an input activation, iv is an initial/bias value, and $f$ is an activation function (e.g., a nonlinear function such as sigmoid or hyperbolic tangent). The example computation above involves computing a weighted sum of input activations multiplied by weights, adding the bias/initial value iv to the weighted sum, and then applying the activation function $f$. The activation function determines the behavior of the output value of the node as a function of the parenthetical term, and may be configured to constrain the output value to a range (e.g., from −1 to +1). Nonlinear functions map the output values onto a shape that is nonlinear, i.e., not a straight line. It is understood, however, that nonlinear functions can provide for an output value range in which at least some portions are linear. For example, rectified linear unit (ReLU) is shaped like two lines that are connected, but with different slope. The weights are typically represented as a vector, where each element of the vector is a weight value. Similarly, the input activations can also be represented as a vector so that the multiplication of the weights with their corresponding input activations is expressed as a dot product. Generally, weights are determined based on training that occurs prior to executing the neural network on actual input, i.e., offline. During training, a set of training inputs are processed through the neural network to adjust the weights based on the results (e.g., inferences) generated using the training inputs.

From the example above, it is apparent that computations in a neural network can involve large quantities of data. The computing system that executes the neural network has to have enough memory to store the weights as well as enough memory to store the activations. However, it is not always desirable for an NNA to include sufficient memory for storing all the weights and activations that are needed to fully execute the entire neural network, that is, from input layer all the way through the output layer. For instance, in implementations where the NNA is part of a computing system that already includes memory for storing weights, it would be wasteful in terms of hardware cost and power consumption to have the NNA maintain the entire set of weights in local storage when, instead, the weights could be transferred from the system memory to the local memory of the NNA as needed by the NNA. This is especially true when the NNA is configured to execute only part of the neural network or to execute the neural network in phases. For example, the NNA may receive and execute program code for some, but not all of the layers, and then receive and execute additional program code for the rest of the layers. As another example, in some implementations, multiple NNAs may execute different portions of the neural network in parallel (e.g., two different parts of the same layer) in order to reduce the overall execution time for the neural network.

Additionally, when transferring data into or out of the NNA, bandwidth becomes an issue because transferring the data too slowly will delay the processing of the data by the NNA. This is particularly problematic for data that is written to system memory from the NNA and then back to the NNA for subsequent processing. For example, output activations computed by one layer of the neural network may, in some embodiments, be stored to system memory and then loaded back into the same or a different NNA for input to another layer of the neural network. One way to improve transfer speed is to apply a compression scheme to reduce the amount of data that is transferred. Various compression schemes exist that are adapted for different types of data. For instance, compression of audio data generally involves a different type of compression scheme than compression of image data.

For a compression scheme to be useful, the amount of data reduction should outweigh the cost of implementing the compression scheme. The cost includes the extra computational resources needed in order to compress and decompress the data. Further, care should be taken not to over-compress the data as this could lead to loss of critical information. In a neural network, over-compression may reduce the accuracy of the inferences produced by the output layer. Accordingly, the performance of a compression scheme can be measured and analyzed to determine which compression scheme or combination of compression schemes to use for any particular set of data.

Performance can be measured in various ways, including in terms of an amount of compression (e.g., a target compression ratio or target compression percentage) and/or an accuracy level of the inferences produced throughout offline execution of the neural network using compressed data (e.g., a target percentage of correct inferences when the neural network is executed using weights compressed according to a compression scheme under consideration, in combination with using training data as input to the first layer of the neural network). When multiple types of compression are combined, the performance of each compression type can be analyzed independently. Alternatively, the overall performance based on the results of applying different compression types in combination with each other can be analyzed.

In certain embodiments, weights are compressed offline. Offline weight compression is possible because, as explained above, weights are generally determined prior to executing the neural network. To determine the appropriate compression scheme configuration to use for compressing the weights, the performance of different compression scheme configurations can be analyzed. The compression scheme configurations can include variations on one or more types of compression. For example, compression parameters can be varied to adjust the amount of compression contributed by any particular compression type.

In certain embodiments, activations are compressed during runtime, when the neural network is being executed on real (non-training) input. Generally, offline compression of activations is not feasible because the activations are generated by executing the neural network on the non-training input, and the non-training input is not available prior to runtime. Therefore, unlike weights, activations are not usually known in advance. Performance analysis can still be applied to determine the appropriate compression scheme(s) to use for compressing the activations, but the analysis may differ from that used for offline compression of weights. For instance, a more computationally efficient analysis (e.g., based on fewer compression scheme configurations and/or based on fewer performance metrics) can be used in order to guarantee that the activations are compressed prior to when the activations are needed.

Neural Network Accelerator Overview

FIG. 1 is a simplified block diagram of an NNA 100 according to certain embodiments. The NNA 100 comprises a host interface 110, a control sequencer 112, an optional processor 114, an activation buffer access unit 120, a weight buffer access unit 122, a plurality of neural processing units (NPUs) 124, 126, and 128, an output buffer access unit 130, a set of local memory buffers 140, and a data move engine (DME) 150. The activation buffer access unit 120, the weight buffer access unit 122, the NPUs 124, 126, and 128, and the output buffer access unit 130 collectively form a compute engine 116. Along with the control sequencer 112 and the DME 150, the compute engine 116 is responsible for executing instructions. The NNA 100 can be implemented as a standalone computing system or, as shown in FIG. 1, as part of a computing system comprising a host processor and system memory.

The NNA 100 depicted in FIG. 1 is merely an example and is not intended to unduly limit the scope of claimed embodiments. One of ordinary skill in the art would recognize many possible variations, alternatives, and modifications. For example, in some implementations, NNA 100 may have more or fewer components than those shown in FIG. 1, may combine two or more components, or may have a different configuration or arrangement of components.

The NNA 100 generally executes one set of instructions at a time. This set of instructions is referred to herein as a "context." At runtime, the NNA 100 sequences and dispatches, using control sequencer 112, instructions from a pre-compiled context for execution. In certain embodiments, each context comprises a set of instructions that ends with a HALT instruction. Contexts are created by a software compiler. The instructions within a context can implement at least part of a neural network. For example, a context can correspond to a complete layer, a partial layer, or multiple layers of the neural network. In some instances, a context can correspond to a complete neural network (e.g., with instructions for an input layer, a hidden layer, and an output layer).

The host interface 110 is a communication interface to the host processor (not depicted) of the local computing system. The local computing system includes system memory for storing data operated on by the NNA (e.g., weights, activations, and output values corresponding to inferences). The NNA 100 may be communicatively coupled to multiple hosts simultaneously, with any one of the hosts being able to program the NNA 100 to execute neural network-related tasks on behalf of the host. The host interface 110 can communicate with the host processor via a standard communication protocol such as, for example, Advanced eXtensible Interface (AXI) protocol. Similarly, the NNA 100 can include a separate communication interface for communicating with the system memory, e.g., to read and write data from the local memory buffers 140 to the system memory. The communication interface to the system memory is, in certain embodiments, integrated into the DME 150. Thus, the DME 150 can also include an AXI interface.

The control sequencer 112 is responsible for sequencing, dispatching and finishing execution of instructions. Some instructions are executed entirely in the control sequencer 112. Other instructions may be dispatched to one or more of the NPUs 124, 126, and 128 for execution, possibly with execution results being returned to the control sequencer 112 for further processing. Still other instructions are executed by the DME 150 to move data to and from the local memory buffers 140. More than one instruction can be in the execution phase at any given time within the NNA 100. The control sequencer 112 can include an instruction memory into which instructions to be executed by the NNA 100 are downloaded from the host processor or loaded from the system memory.

In the example of FIG. 1, the host interface 110 includes a configuration memory. The configuration memory may include one or more registers that are configurable by the host processor to specify parameters relating to the context to be executed, e.g., various context dependent parameter registers (CDPRs).

In certain embodiments, the configuration memory includes a predicate register for synchronizing execution of instructions. Instructions are broadcast by the control sequencer 112 to each component of the compute engine 116 as well as the local memory buffers 140 and the DME 150. Upon receipt of a broadcast instruction, a component may proceed to execute at least part of the instruction in response to determining that the component is capable of handling the instruction. For example, the DME 150 could receive and execute a data move instruction, but the NPUs 124, 126, and 128 could ignore the data move instruction. Because instructions can execute concurrently in different components, it is useful to have a synchronization mechanism to handle any dependencies between instructions. The predicate register can be used to implement such a synchronization mechanism and, in certain embodiments, is a global register visible to internal components of the NNA 100, as well as visible to external entities such as the host processor. Synchronization also helps to prevent conflicts in accessing the local memory buffers 140.

The processor 114 is an optional general purpose processor for performing certain types of processing in parallel with processing performed by the NPUs 124, 126, and 128. For example, processor 114 may include a floating point unit or other arithmetic logic unit for performing general arithmetic operations in parallel with matrix operations performed by the NPUs 124, 126, and 128.

The activation buffer access unit 120 is configured to access one or more activation buffers in the local memory buffers 140. Similarly, the weight buffer access unit 122 and the output buffer access unit 130 are configured to access one or more weight buffers and one or more output buffers, respectively. The activations stored in the activation buffer(s) correspond to activations produced by one or more layers of a neural network being executed on the NNA 100. The weights stored in the weight buffer(s) are synaptic weights associated with edges between a node of one layer and a node of another layer. Activation and weights are used for certain computations, including for instructions executed by the compute engine 116. The output buffers can store final results or intermediate results (e.g., partial sums) for access by the host processor or the system memory.

The NPUs 124, 126, and 128 perform numerical operations using the activations and weights stored in the local memory buffers 140. Each NPU is configured to perform all or part of a compute instruction. Although FIG. 1 depicts the NPUs 124, 126, and 128 as block components, the NPUs 124, 126, and 128 are not necessarily identical. For example, as described in connection with FIG. 2, the operations of one NPU may differ from the operations performed by another NPU.

The DME 150 is used to bidirectionally move instructions and data between the system memory and NNA local memories (e.g., the activation, the weight, and output buffers that form the local memory buffers 140). The DME 150 can receive data move instructions (e.g., LOAD and STORE instructions) from the control sequencer 112 when such instructions are broadcast. The data move instructions executed by DME 150 can execute concurrently with compute instructions executed by the control sequencer 112 or the compute engine 116.

As shown in FIG. 1, the DME 150 includes a decompression unit 152 and a compression unit 154. In other embodiments, the DME 150 may include a decompression unit or a compression unit, but not both. Further, the location of the compression unit or decompression unit can vary. For example, in another embodiment, the decompression unit 152 can be part of the compute engine 116 and is configured to decompress data stored in the local memory buffers 140 for input of the decompressed data to one or more of the NPUs 124, 126, and 128.

Figure 3:
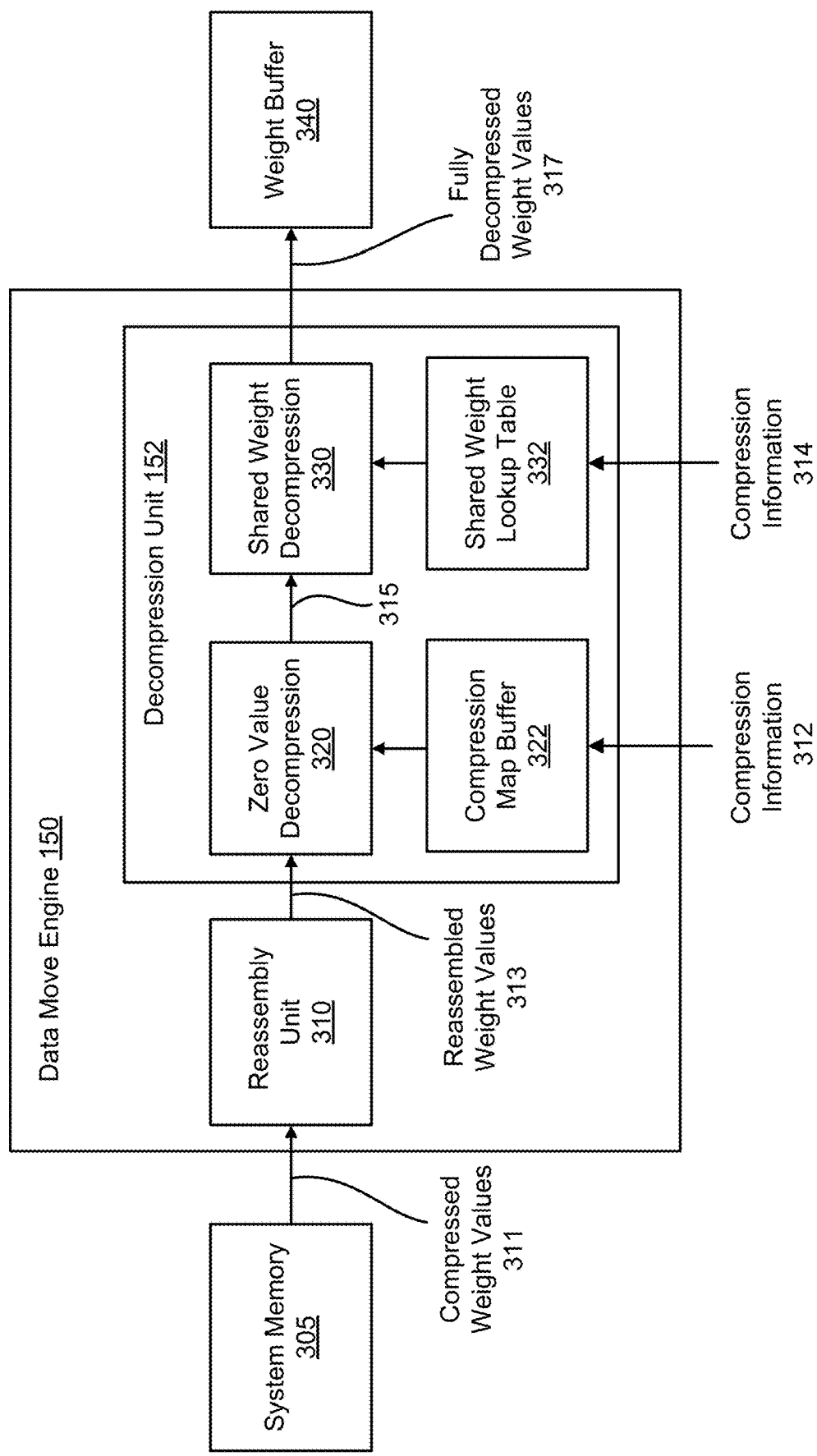
FIG. 3 illustrates an example decompression pipeline, according to certain embodiments.

The decompression unit 152 implements a decompression pipeline. An example of a decompression pipeline is shown in FIG. 3. The decompression pipeline of the decompression unit 152 involves processing using one or more decompression schemes. The decompression unit 152 can select between using one decompression scheme alone or using multiple decompression schemes in combination. For example, the decompression unit 152 may decompress data using zero value decompression and then further decompress the data using shared value decompression. In the example of zero value plus shared value decompression, the order in which the compression schemes are applied can vary depending on how the decompression unit 152 is implemented. Thus, zero value decompression could be performed first followed by shared value decompression. Alternatively, shared value decompression could be performed first. In general, the order in which zero value decompression and shared value decompression are performed does not matter as the resulting decompressed data would be the same irrespective of which decompression scheme is applied first.

Although the example embodiments are described in connection with zero value compression/decompression and shared value compression/decompression, other techniques for compressing and decompressing data can be implemented. These are merely two examples of compression/decompression schemes that are suitable for use with the types of data involved in neural networks.

In the example of FIG. 1, the decompression unit 152 may be configured to receive compressed data from the system memory and decompress the compressed data, using one or more decompression schemes, to generate decompressed data for storage in the local memory buffers. Alternatively, in certain embodiments, the decompression unit 152 may be configured to receive compressed data from the local memory buffers and decompress the compressed data for use by a processing component of the NNA 100 (e.g., one of the NPUs 124, 126, and 128, or the control sequencer 112). Thus, the data may be stored in either compressed or decompress form within the local memory buffers 140. Irrespective of how the data is stored in the local memory buffers 140, the data may be sent from the system memory to the NNA 100 in compressed form. Sending the data to the NNA in compressed form reduces the amount of time required to send the data.

The compression unit 154 implements a compression pipeline similar to the decompression pipeline discussed above with respect to the decompression unit 152. In certain embodiments, the compression unit 154 is configured to receive uncompressed data produced by the neural network (e.g., output values corresponding to inferences and/or activations generated by a particular layer of the neural network) and apply one or more compression schemes to compress the uncompressed data for storage in the local memory buffers 140 or for storage in the system memory. For example, activations produced by one layer can be compressed for temporary storage in an activation buffer of the local memory buffers 140 until the activations are needed by one of the NPUs 124, 126, 128. Storing the activations in compressed form increases the effective storage capacity of the activation buffer. For the same amount of physical memory, more activations can be stored when the activations are compressed compared to when the activations are stored uncompressed. As another example, inferences produced by the output layer of the neural network or activations produced by a particular layer can be compressed for storage in the system memory.

The local memory buffers 140 are used to abstract the physical implementation of memories that form the activation, weight, and output buffers from NNA components (e.g., the compute engine 116 and the DME 150) that access data in these buffers. The data in the activation, weight, and output buffers is accessed through addressing the buffers individually, with the buffer addresses being mapped to the physical addresses of the memories where the data is stored. In certain embodiments, the memories of the local memory buffers 140 are implemented as static random-access memory (SRAM) devices. However, the local memory buffers 140 can be implemented using other types of memory, both volatile and non-volatile (e.g., flash memory, DRAM, resistive RAMs, and the like). As mentioned above, the data in be stored in the local memory buffers 140 in compressed or decompressed form.

The NPUs 124, 126, and 128 perform numerical operations using the activations and weights stored in the local memory buffers 140. Each NPU is configured to perform all or part of a compute instruction. The compute instruction may, for example, implement at least some of the computation described earlier in connection with processing by a node of a neural network, i.e., computing a weighted sum of input activations multiplied by weights, adding a bias value to the weighted sum, and then applying an activation function. Other types of computations may also be performed by the NPUs 124, 126, and 128 including, for example, identifying the minimum and maximum values among a first set of data values represented by a first vector and a second set of data values represented by a second vector, performing an extended multiply add, subtracting two vectors, and other types of operations applicable to data from a vector or matrix.

Figure 2:
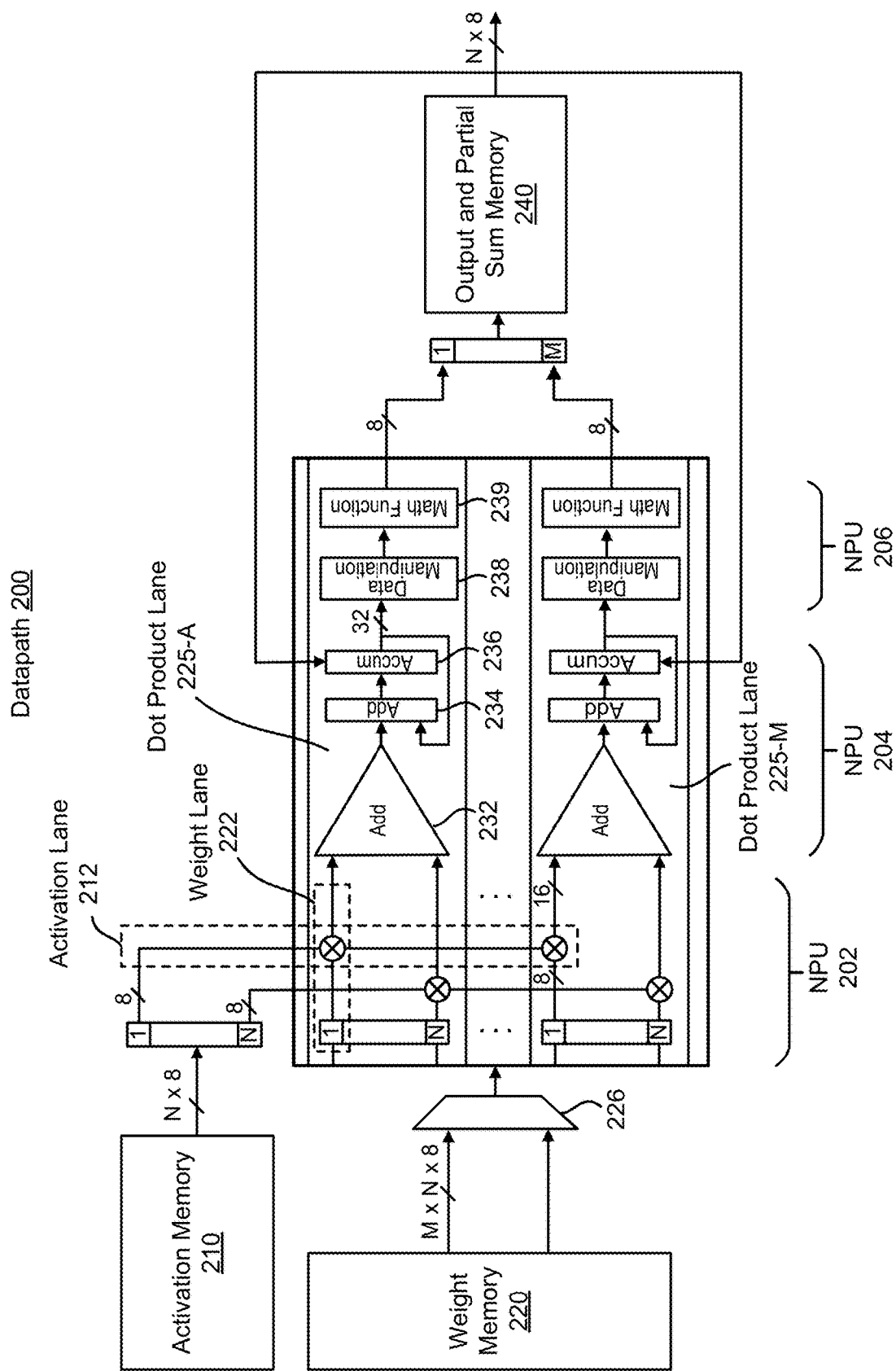
FIG. 2 shows an example datapath for operations performed within a compute engine of a neural network accelerator, according to certain embodiments.

FIG. 2 shows an example datapath 200 for operations performed within a compute engine, e.g., the compute engine 116. As shown in FIG. 2, a plurality of NPUs 202, 204, and 206 are communicatively coupled to an activation memory 210 and a weight memory 220. The NPUs 202, 204, and 206 are coupled together to form a processing pipeline, and can correspond to the NPUs 124, 126, and 128, respectively. The activation memory 210 and the weight memory 220 may correspond to the activation buffers and the weight buffers in the local memory buffers 140, respectively. In the example of FIG. 2, the processing performed by each NPU 202, 204, and 206 involves M dot product lanes 225 of N inputs each. Two dot product lanes 225-A and 225-N are shown. In FIG. 2, the activations are 8-bit data values, N activations in total being read out of the activation memory 210 to all M dot product lanes 225. Similarly, the weights are 8-bit data values, N weights per dot product lane 225, for a total of M×N×8 bits of weight data that are read out of the weight memory 220 into a multiplexer 226 for distribution to the dot product lanes 225, with a different set of N weights being supplied to each dot product lane 225. However, in other implementations, the activations and the weights could be represented using a different number of bits. Further, the number of bits used to represent an activation are not necessarily always equal to the number of bits used to represent a weight.

Each dot product lane 225 computes N number of dot products between a weight value and an activation value, with the results being summed by an adder 232 for input to an adder 234. The adder 234 computes a running total for input to an accumulator 236, using the current value of the accumulator 236 and the output of the adder 232. As shown in FIG. 2, the NPU 202 can handle computation of the dot products, and the NPU 204 can handle the summation and accumulation.

The accumulator 236 stores intermediate results generated by the adder 234. Intermediate results are often accumulated in the layers of certain types of neural networks, such as fully connected and convolutional layers. To avoid overflow, the accumulator 236 can be implemented with a higher bit width compared to the weights and activations, e.g., 32-bit.

Once the accumulator 236 has completed an accumulation sequence, the result stored in the accumulator 236 can be written to an output and partial sum memory 240 (e.g., an output buffer in the local memory buffers 140) after processing through a data manipulation block 238 that can optionally down shift the output of the accumulator 236, e.g., to an 8-bit value using a quantization algorithm. The data manipulation block 238 can also perform other data manipulations such as applying clipping and/or a scale factor. The output of the data manipulation block 238 is then sent to a math function block 239 that applies an activation function, which can be a nonlinear function (e.g., rectified linear unit (ReLU), hyperbolic tangent (Tanh), or sigmoid). The data manipulation block 238 and the math function block can be implemented by the NPU 206. The outputs of all M math function blocks are then combined into a single vector for transmission to output and partial sum memory 240. The output and partial sum memory 240 may store either output activations (which can be read back into the activation memory 210 for input to a subsequent computation by the same or a different neural network layer) or partial sums that are accumulated. Output activations can, in some embodiments, be transferred directly from the output and partial sum memory 240 into the activation memory 210. Alternatively, the output activations can be temporarily transferred to system memory before loading the output activations into the activation memory 210.

Example Decompression Pipeline

FIG. 3 illustrates an example decompression pipeline, according to certain embodiments. In the example of FIG. 3, the decompression pipeline is implemented using the decompression unit 152 within the DME 150 of FIG. 1 and involves decompression of compressed weight values 311. However, the techniques described with respect to FIG. 3 can be applied to decompression units located elsewhere in the NNA, as well as to other types of neural network data including, but not limited to, activations.

As shown in FIG. 3, the compressed weight values 311 are loaded from a system memory 305 into a reassembly unit 310 of the DME 150. The reassembly unit 310 is configured to read and assemble the compressed weight values 311. For example, the compressed weight values 311 may correspond to values from a two-dimensional weight matrix, with the matrix values being transmitted from the system memory 305 in a certain order (e.g., row-by-row, column-by-column, multiple rows at a time, or multiple columns at a time). The reassembly unit 310 can rearrange and combine the compressed weight values 311 as appropriate for consumption by the decompression unit 152, to generate reassembled weight values 313 that have yet to be decompressed.

The decompression unit 152 includes, in this example, a zero value decompression unit 320 and a shared weight decompression unit 330. In certain embodiments, the zero value decompression unit 320 and the shared weight decompression unit 330 are implemented in hardware. However, implementation in software or a combination of hardware and software are also possible. The zero value decompression unit 320 applies a zero value decompression scheme to the reassembled weight values 313, thereby generating partially decompressed weight values 315 for input to the shared weight decompression unit 330.

Figure 4:
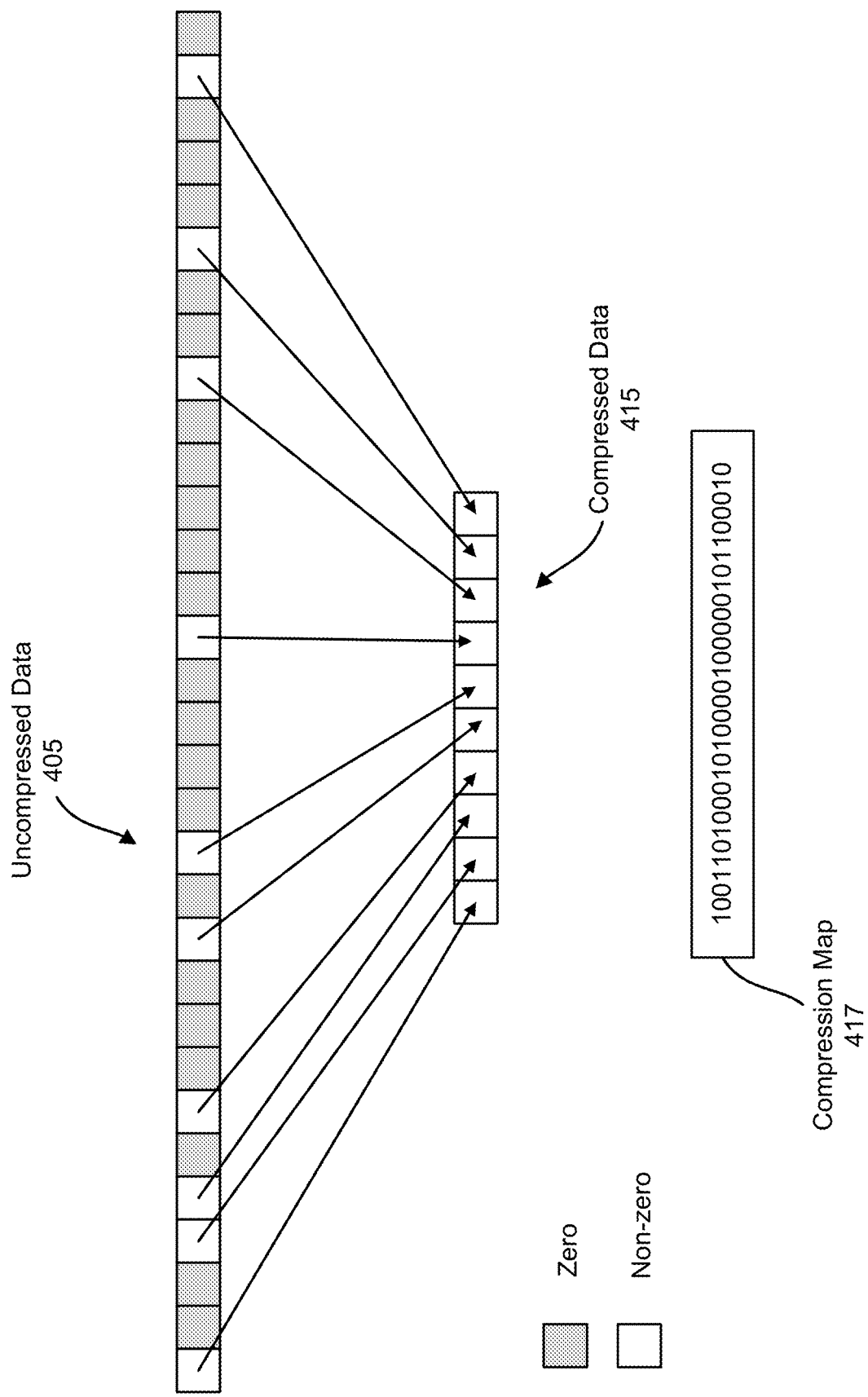
FIG. 4 illustrates an example of a zero value compression scheme, according to certain embodiments.

The zero value decompression unit 320 may perform the decompression of the reassembled weight values 313 based on compression information 312 contained in a compression map (CMAP) buffer 322. The compression information 312 may include a CMAP and/or other information indicating how the compressed weight values 311 were compressed through zero value compression. An example of a CMAP is shown in FIG. 4. The compression information 312 can be supplied by the system memory 305 and sent together with the compressed weight values 311. For example, the compression information 312 can be included in a header section of one or more data packages containing the compressed weight values 311. Alternatively, the compression information 312 could be sent from another component of the computing system, such as a host processor. Thus, compression information can be stored together with compressed data or sent separately.

In situations where the compressed weight values 311 have not been compressed using zero value compression, the zero value decompression unit 320 can simply forward the reassembled weight values 313 to the shared weight decompression unit 330 for decompression. Thus, the zero value decompression unit 320 can operate as a pass-through when zero value decompression does not need to be performed. Alternatively, in certain embodiments, the decompression unit 152 may include bypass logic that routes the reassembled weight values 313 to the shared weight decompression unit 330, skipping the zero value decompression unit 320 entirely. Similarly, the shared weight decompression unit 330 can forward the output of the zero value decompression unit 320 to the weight buffer 340, or the shared weight decompression unit 330 can be bypassed, when the compressed weight values 311 have not been shared weight compressed. The DME 150 can instruct the zero value decompression unit 320 and the shared weight decompression unit 330 as to whether to perform decompression, e.g., based on compression mode information supplied in a LOAD instruction (described below). Alternatively, each decompression unit may be configured to independently determine whether it needs to perform decompression, e.g., based on the contents of a control register that is set by the LOAD instruction to indicate which compression mode to use.

FIG. 4 illustrates an example of a zero value compression scheme that can be used to generate compressed data, e.g., the compressed weight values 311 in FIG. 3. In the example of FIG. 3, the zero value compression scheme can be implemented offline, e.g., by the software compiler. However, the zero value compression scheme illustrated in FIG. 4 can also be used for compression of data during runtime (e.g., by a compression unit of the NNA).

As shown in FIG. 4, uncompressed data 405 (e.g., the weights that are compressed to form the compressed weight values 311) comprises zero values and non-zero values. These values may, for example, be integer values or floating point values. In a neural network, weights can span a range of values, and the range can vary depending on the particular neural network. For example, the range could be from −0.06 to +0.06. As mentioned earlier, most of the data values in a neural network are zero valued, making the data amenable to zero value compression. This is true not only for weights, but also for other types of data operated on by the neural network. If the zero values are eliminated, then the data can be represented in a more compact form, e.g., as compressed data 415 corresponding to uncompressed data 405 after removal of zero values. Further, if data values that are not exactly zero, but close to zero (e.g., within a certain range of zero) are also eliminated, then the data can be compressed even more. The elimination of such non-zero values is omitted in FIG. 4 for simplicity. The range can be specified as a zero threshold, e.g., a single value whose magnitude determines the boundaries of the range. For instance a zero threshold of 0.06 could be used to define the −0.06 to +0.06 range mentioned above. However, the range does not have to be symmetric about zero. Thus, the range could be specified using more than one value, e.g., a first value setting the boundary on the negative side and a second value setting the boundary on the positive side.

The zero value compression scheme in FIG. 4 differs from the run length encoding schemes sometimes used for compressing image data. In a zero value based run length encoding scheme, the compression involves identifying a string of consecutive zeroes in the data to be compressed. Instead of being dependent on how the data to be compressed is organized, the zero value compression scheme of FIG. 4 achieves the same level of compression regardless of the size or location of zero value runs in the data.

One of the challenges with eliminating values that are close to zero is that the removal of these values can potentially lead to inference degradation, meaning the accuracy of the inferences produced by the neural network will decrease. In most instances, removal of such values does not affect the overall accuracy to any significant degree. However, being too aggressive in eliminating values that are close to zero can lead to an unacceptable level of accuracy. Accordingly, the threshold for how close a non-zero value can be to zero in order to be eliminated can be set appropriately to avoid generating too many incorrect inferences. In certain embodiments, the threshold for zero value compression is a configurable parameter.

FIG. 4 also shows a CMAP 417 for the compressed data 415. The CMAP 417 can be a binary bit-map that indicates which values were removed from the uncompressed data 405 to generate the compressed data 415. For example, the CMAP 417 may include a total number of bits equal to the number of values in the uncompressed data 405, where each bit is indexed to a position of a corresponding value of the uncompressed data 405. Setting a bit to a particular value (e.g., 1) indicates that the value at that position was not eliminated. Setting the bit to a different value (e.g., 0) indicates that the value at that position was eliminated, and therefore not included in the compressed data 415. Thus, the CMAP 417 can be used to reconstruct the uncompressed data 405 or an approximation thereof during decompression of the compressed data 415. In implementations where only zero values are eliminated, the CMAP 417 can be used to exactly reconstruct the uncompressed data 405 because it is implied that all eliminated values are zero. In implementations where values that are close to zero are also eliminated, exact reconstruction of the uncompressed data 405 is not possible without further information on the values that were eliminated. This is because the CMAP 417 only indicates which uncompressed values were eliminated. In the absence of additional information of the eliminated non-zero values, the uncompressed data 405 would be reconstructed by assuming that the eliminated non-zero values were all zero.

The CMAP 417 represents an additional memory overhead incurred in connection with zero value compression. In particular, although a certain number of values from the uncompressed data 405 were eliminated, the generating of the CMAP 417 produces extra information that is not present in the uncompressed data 405. In most instances, the CMAP does not add much overhead in comparison to the amount of data eliminated. However, there are some situations where the added cost of using the CMAP to track which values were eliminated outweighs the benefit of data elimination. For example, if the uncompressed data 405 were to consist of mostly non-zero values that do not fit the criteria for elimination, then the CMAP would be considered an unnecessary expense that actually increases the total amount of information that is needed for decompression processing. Accordingly, the data to be compressed should be analyzed to determine whether it is suited to zero value compression, or whether a different type of compression would be better suited.

Turning back to FIG. 3, the shared weight decompression unit 330 may perform decompression of the partially decompressed weight values 315 to generate fully decompressed weight values 317 for storage in a weight buffer 340. The decompression of the partially decompressed weight values 315 can be based on compression information 314 stored in a shared weight lookup table (LUT) 332. Thus, the compression information 314 may comprise information representing a lookup table. Similar to the compression information 312, the compression information 314 can be supplied from the system memory 305 or a host processor. For example, the compression information 314 can be sent in the same package or set of packages as the compressed weight values, and may be present in the partially decompressed values 315 (e.g., carried over from the decompression by the zero value decompression unit 320). The compression information 314 indicates how the compressed weight values 311 were compressed through shared weight compression. However, the type of compression information used for a shared weight LUT differs from that used for a CMAP, as explained below in connection with FIG. 5.

Figure 5:
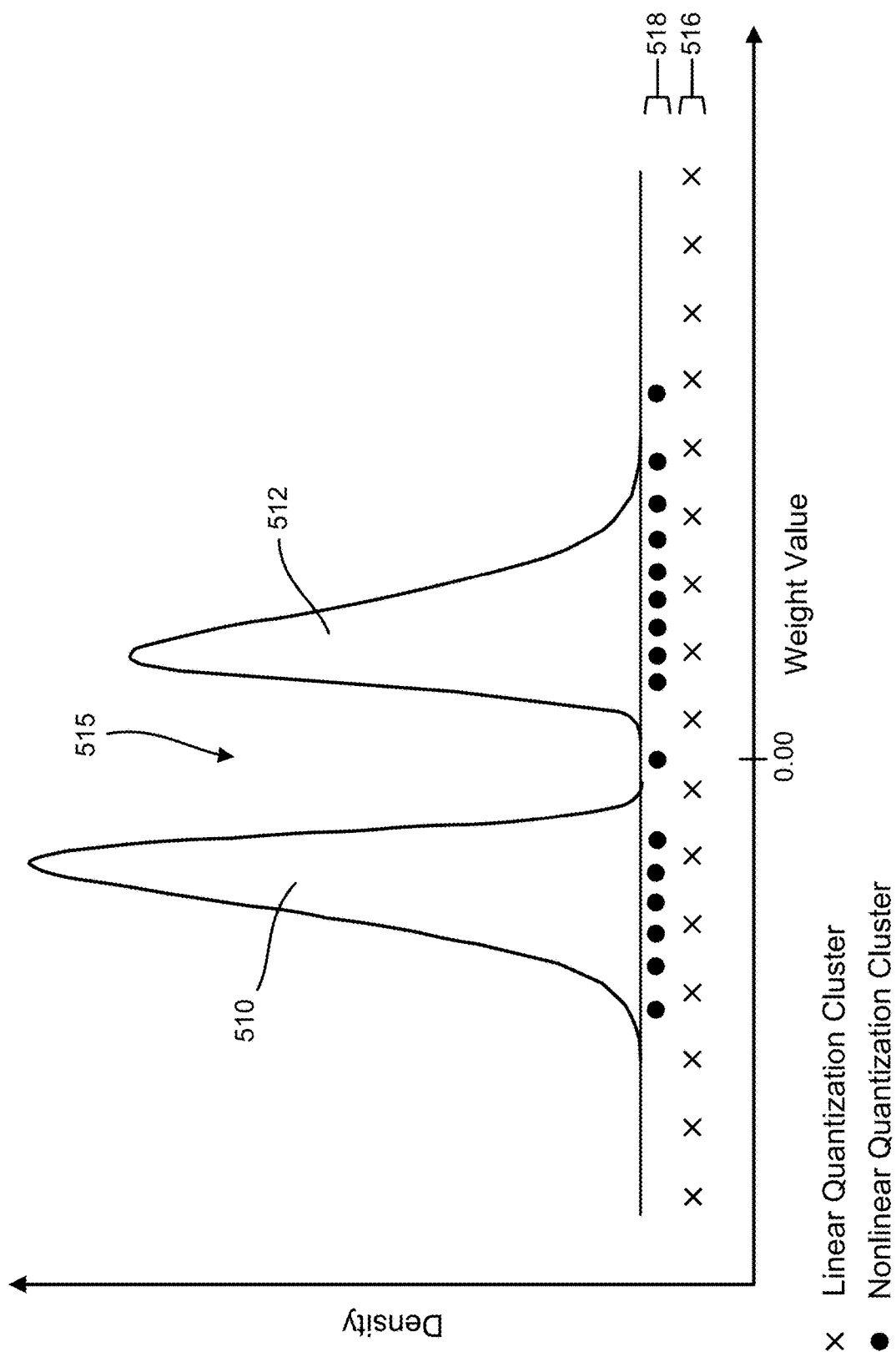
FIG. 5 illustrates an example of a shared value compression scheme, according to certain embodiments.

FIG. 5 illustrates a shared weight compression scheme that can be used to generate compressed data, e.g., the compressed weight values 311 in FIG. 3. In the example of FIG. 5, shared weight compression is applied to data that was previously compressed using zero value compression. The data is represented by distribution curves 510 and 512, which correspond to a histogram formed by plotting the density of the data versus the value of the data (e.g., the total number of weights that share any particular weight value). As shown in FIG. 5, the distribution curves 510 and 512 are spaced apart by a gap 515 located around a weight value of zero. This is a result of applying zero value compression to eliminate values that are zero or close to zero. If zero value compression had not been applied, then there would be a single distribution curve instead of two separate curves.

The shared weight compression scheme in FIG. 5 is an example of a shared value compression scheme. In a shared value compression scheme, similar data values are mapped onto the same value so that the total number of distinct values needed to represent the data is reduced. The data values are therefore clustered into groups around these distinct values. Each cluster has an associated value (e.g., the centroid of the cluster) that is substituted for each data value in the cluster. In FIG. 5, the data values are weight values. Weight sharing can reduce the number of bits required to represent each weight. Weight sharing can also limit the number of effective weights, since certain weight values are not represented in the compressed data. In certain embodiments, clustering is applied on a per-layer basis so that weights are shared within a layer, but not between layers.

In comparison to the zero value compression described in connection with FIG. 4, weight sharing generally involves less memory overhead. In particular, there is no mapping required to determine the corresponding uncompressed value. Instead, each weight is simply encoded according to the value associated with the cluster into which the weight is grouped. The encoding can be a binary encoding where the number of bits is dependent on the total number of clusters. For example, given k clusters of weights, only log 2(k) bits may be required to encode a weight. The encoding represents a cluster index that identifies a particular cluster. For example, if there are 32 clusters, a 5-bit value of 00011 can be used to represent cluster number 3. When generating compressed data, a separate instance of the cluster index can be substituted for a value assigned to that particular cluster. During decompression, each instance of the cluster index can be replaced with the value represented by the cluster, where the value represented by the cluster is determined by referencing a lookup table (e.g., shared weight LUT 332) using the cluster index.

In certain embodiments, the number of clusters is a configurable parameter. For example, the compression unit may support cluster sizes of 4, 8, 16, or 32. Increasing the number of clusters increases the accuracy of the representation of the uncompressed weights, and therefore inference accuracy, but has a tradeoff of larger compressed weights. Based on how many clusters were used, the decompression unit can determine the value that the encoding is supposed to represent. Thus, the compression information 314 in FIG. 3 can include an indication of the number of clusters used. In some instances, the compression information 314 can also indicate the value represented by each cluster.

To determine the appropriate number of clusters, as well as the cluster assignments and the values represented by each cluster, the compression unit can, in certain embodiments, apply a k-means clustering algorithm to identify the value for k that minimizes the following formula, which represents a cost function:

$$\arg\min_{C} \sum_{i=1}^{k} \sum_{w \in C_i} |w - c_i|^2$$

where for a set of weights $W=\{w_1, w_2, \ldots w_n\}$, the weights are grouped into k clusters $C=\{c_1, c_2, \ldots c_k\}$, and n is much greater than k. The formula above corresponds to the sum over all clusters of the in-cluster sum of the squared difference between the value of each weight assigned to a particular cluster $c_i$ and the value represented by Thus, a weight can be assigned to a particular cluster based on proximity or distance to a value represented by the cluster. The k-means clustering algorithm described above is just an example. Other clustering algorithms exist which would also be suitable for determining the total number of clusters and their associated values.

FIG. 5 shows two ways to implement weight sharing. One is based on linear quantization. The other is based on nonlinear quantization. In linear quantization, every cluster (shown in the figure as an "X") is equally spaced apart, i.e., equidistant. Thus, a set of linear clusters 516 may comprise clusters that are evenly distributed across the entire range of possible weight values. In nonlinear quantization, the clusters (shown in the figure as circles) are not necessarily equally spaced. Thus, a set of nonlinear clusters 518 may comprise clusters that are unevenly distributed. Further, as shown in FIG. 5, the range of values spanned by the nonlinear clusters 518 can be configured to fall within the actual range of weight values instead of spanning the entire range of possible weight values, thus enabling the weights to be more accurately represented.

Example Compression Pipeline

Figure 6:
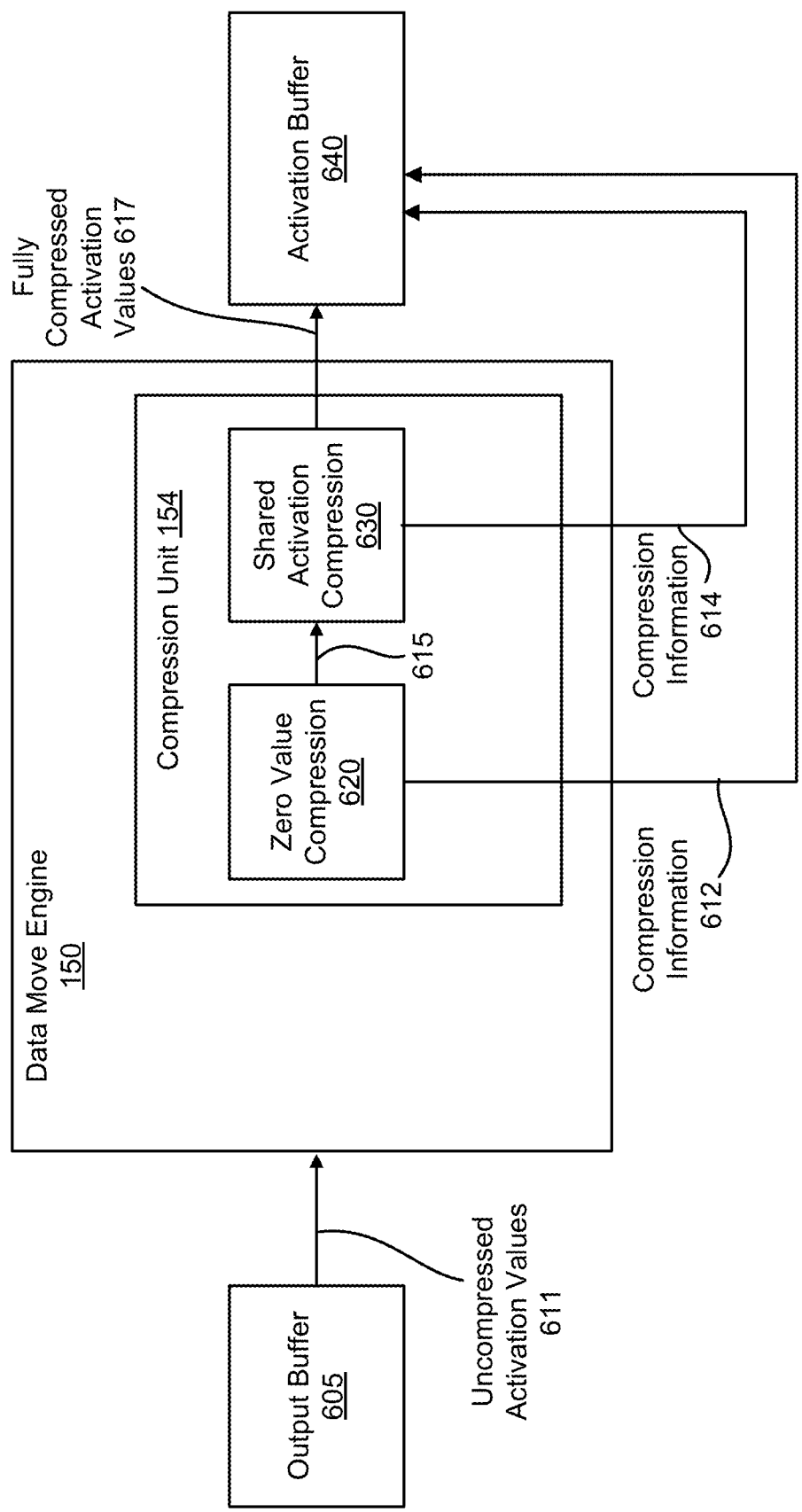
FIG. 6 illustrates an example compression pipeline, according to certain embodiments.

FIG. 6 illustrates an example compression pipeline, according to certain embodiments. In the example of FIG. 6, the compression pipeline is implemented using the compression unit 154 within the DME 150 of FIG. 1 and involves compression of uncompressed activation values 611. However, the techniques described with respect to FIG. 6 can be applied to compression units located elsewhere in the NNA, as well as to other types of neural network data, e.g., weights.

As shown in FIG. 6, the uncompressed activation values 611 are initially stored in an output buffer 605 and read into compression unit 154 to generate compressed activation values 617. The transferring of the uncompressed activation values 611 to the compression unit 154 can be performed through a data move component (not shown) that is analogous to the reassembly unit 310 in FIG. 3. In the example of FIG. 6, the destination memory for compressed activation values 617 is an activation buffer 640. The example of FIG. 6 may correspond to the situation in which the uncompressed activation values 611 are output activations that are produced by a hidden layer and temporarily stored in the output buffer 605 for input to the next layer. Thus, the compressed activation values 617 may, in this scenario, be written to the activation buffer 640 for subsequent decompression when the activations are needed by the next layer. As another example, instead of being written to the activation buffer 640, the compressed activation values 617 could be written to system memory, e.g., for storage as the final results of the neural network, or for subsequent loading back to the same or a different NNA. Alternatively, the compressed activation values 617 could be sent to a remote computing system, e.g., to a cloud server through a network interface of the computing system in which NNA 100 is deployed. The remote computing system may execute a neural network using the compressed activation values 617 or perform some other downstream processing of the compressed activation values 617.

The compression unit 154 can employ compression schemes that are counterparts to the decompression schemes discussed earlier in connection with the decompression unit in FIG. 3. For example, as shown in FIG. 6, the compression unit 154 can include a zero value compression unit 620 and a shared activation compression unit 630. In certain embodiments, the zero value compression unit 620 and the shared activation compression unit 630 are implemented in hardware. However, implementation in software or a combination of hardware and software are also possible. The zero value compression unit 620 applies a zero value compression scheme (e.g., the compression scheme described in connection with FIG. 4) to the uncompressed activation values 611, thereby generating partially compressed activation values 615 for input to the shared activation compression unit 630.

The zero value compression unit 620 may, as part of performing the compression of the uncompressed activation values 611, generate compression information 612 for use in subsequent decompression of the fully compressed activation values 617 (e.g., decompression performed by the decompression unit 152). Thus, the compression information 612 could include a CMAP indicating which of the uncompressed activation values 611 were eliminated during the compression by the zero value compression unit 620.

The shared activation compression unit 630 applies a shared value compression scheme (e.g., the compression scheme described in connection with FIG. 5) to the partially compressed activation values 615, thereby generating the fully compressed activation values 617 for storage in the activation buffer 640, system memory, or some other location. In certain embodiments, a more computationally efficient shared value compression scheme can be used when compressing data during runtime (e.g., the compression of the partially compressed activation values 615 by the shared activation compression unit 630). This would enable the data to be compressed more quickly for storage (e.g., in the activation buffer 640 or system memory). For example, instead of computing locations of clusters, the shared activation compression unit 630 could compress the partially compressed activation values 615 using predetermined clusters, e.g., clusters that were determined offline based on training data.

The shared activation compression unit 630 may, as part of performing the compression of the partially compressed activation values 615, generate compression information 614 for use in subsequent decompression of the fully compressed activation values 617. Thus, the compression information 614 could include metadata indicating how many clusters were used for encoding the partially compressed activation values 615 and/or the value represented by each cluster.

Similar to the bypassing described above in connection with the decompression unit 152 in FIG. 3, the compression unit 154 can implement bypassing or forwarding of compressed data when the activation values 611 are to be compressed using only one of zero value compression or shared activation compression.

As shown in FIG. 6, the compression information 612 and the compression information 614 can be stored in the activation buffer 640 together with the compressed activation values 617. In other embodiments, the compression information 612 and the compression information 614 may be stored separately from the compressed activation values 617.

Instruction Based Setting of Compression or Decompression Mode

In certain embodiments, the decompression scheme(s) to apply to compressed data being loaded from system memory into the local memory buffers of the NNA is specified by a LOAD instruction that also executes the loading of the data. Part of the data to be loaded by the LOAD instruction may be compressed concurrently with loading of the remainder of the data to be loaded by the LOAD instruction. Similarly, the compression scheme(s) to apply to uncompressed data being written to system memory from the local memory buffers (e.g., the output buffer in 605 in FIG. 6) can be specified in a STORE instruction that executes the storing of the data into the system memory. An example LOAD instruction is shown below. For simplicity, the details of the STORE instruction are omitted from this disclosure. STORE can be implemented as a counterpart to the LOAD instruction, with similar instruction fields.

Load

LOAD moves a block of data from system memory to a local memory buffer. The load instruction can load one-dimensional (1D) or two-dimensional (2D) data. LOAD has the following fields:

load <pred_in>, <pred_out>, <gpr_src_adr>, <dst_adr>, <num_elem>, <dst_mem>, <mode>, <elm_size>

| 63 62 61 60 | 59 58 57 | 56 55 54 53 | 52 51 50 49 | 48 |
|---|---|---|---|---|
| Reserved | Elm_size | mode | Dst_mem | |

| 47 46 45 44 43 42 41 40 39 38 37 36 35 34 33 | 32 |
|---|---|
| Num Elements | |

| 31 30 29 28 27 26 25 24 23 22 21 20 | 19 18 17 16 |
|---|---|
| Dst_adr | Gpr_adr_base |

| 15 14 13 12 11 | 10 9 8 7 6 5 | 4 3 2 1 0 |
|---|---|---|
| Pred_out | Pred_in | 0000 |

The LOAD fields are described in the following table:

| Field | Description |
|---|---|
| Pred_in | Predicate index, if any, to start the instruction<br>00000 - unconditional start<br>1iiii - conditional start with iiii index in Predicate Register |
| Pred_out | Predicate index to set, if any, at the end of the instruction 00000 - None<br>1iiii - Set iiii index in Predicate Register |
| Num_Elements | Number of elements to transfer/8<br>For load to CMAP, it is just the number of elements |
| Dst_mem | Destination Memory<br>An implementation may not implement all buffers listed below: |

| Memory Buffer | Value |
|---|---|
| Activation Buffer 0 | 0 |
| Activation Buffer 1 | 1 |
| Synaptic Weight Buffer 0 | 2 |
| Synaptic Weight Buffer 1 | 3 |
| Output Buffer 0 | 4 |
| Output Buffer 1 | 5 |
| Compression Map Buffer | 6 |
| Shared Weight LUT | 7 |
| Non Linear Coefficients | 8 |
| Reserved for hardware internal use | 10-15 |

| Field | Description |
|---|---|
| mode | Transfer Mode<br>mode[0] - 0 : local address linear increment<br>         1 : local address banked increment<br>         This mode only effects when destination memory is set to one of the Synaptic Weight Buffers<br>mode[1] - 0 : No decompression using CMAP buffer<br>         1 : Decompress using CMAP buffer<br>mode[2] - 0 : No decompression using Lookup table<br>         1 : Decompress using Lookup table<br>Mode[3] - 0 : NONE<br>         1 : Load 2D Data. 2D Load parameters come from num_elements and gpr_adr_base+1 register |
| Elm_size | Element Size: Size of the packed vector element<br>0: 1-bit<br>1: 2-bits<br>2: 3-bits<br>3: 4-bits<br>4: 5-bits<br>5: 8-bits |

The pred_in field is used to synchronize the LOAD instruction with execution of other instructions. Specifically, the pred_in field refers to a flag bit in a predicate register of the NNA. The flag bit can be set by an instruction whose pred_out field references the flag bit, when that instruction finishes executing. Execution of the LOAD can thus be conditioned on completion of another instruction. Similarly, the LOAD can be configured via the pred_out field to set a flag bit upon completion. The predicate register can include multiple flag bits.

The Gpr_adr_base field has different meanings depending on the instruction in which this field is included. In the case of LOAD instructions, Gpr_adr_base is the base address for a context dependent parameter register that indicates the source address for the load in system memory. Dst_adr is a destination address in the local memory buffers for the data being loaded. Num_Elements indicates the number of data elements being loaded. Note that the size of the data elements is not specified in this field since the data size can vary (e.g., sub-byte loads). The value of Dst_mem indicates which local memory buffer (e.g., an activation buffer, weight buffer, or output buffer) is being loaded. The element size field specifies the size of the data elements being loaded, which in this example can range from 1-bit to 8-bits.

The mode field can be set to indicate, among other things, whether the load is for 1D data (e.g., vectors) or 2D data (e.g., matrices). Additionally, the mode field can be set to indicate which compression scheme or combination of compression schemes to apply to the data that is the subject of the LOAD instruction. For example, as shown in the table above, setting the mode field to index 1, value 1 indicates that a CMAP buffer (and thus zero value decompression) will be used. Setting the mode field to index 2, value 1 indicates that a lookup table (and thus shared value decompression) will be used. Each mode index can be set independently so that the mode field can indicate no decompression, decompression using either zero value or shared value decompression, or both zero value and shared value decompression. Index 1 and index 2 may correspond to values of a 2-bit field in a control register which, in certain embodiments, is part of the decompression unit 152. Similarly, the compression unit 154 can include a control register with a field for specifying, based on the content of a STORE instruction, which types of compression to apply.

In the example LOAD instruction, the specific parameters used for decompressing the data are not specified in the instruction itself. Instead, such parameters can, as explained earlier, be supplied in the form of compression information indicating how the data was compressed. However, the LOAD instruction can participate in supplying this compression information. For example, the LOAD instruction can load a CMAP obtained from system memory to an internal CMAP buffer of the NNA (e.g., CMAP buffer 322 in FIG. 3). The CMAP can be loaded into the CMAP buffer prior to loading of the data itself.

Example Compression/Decompression Processes and Example Computing System

Figure 7:
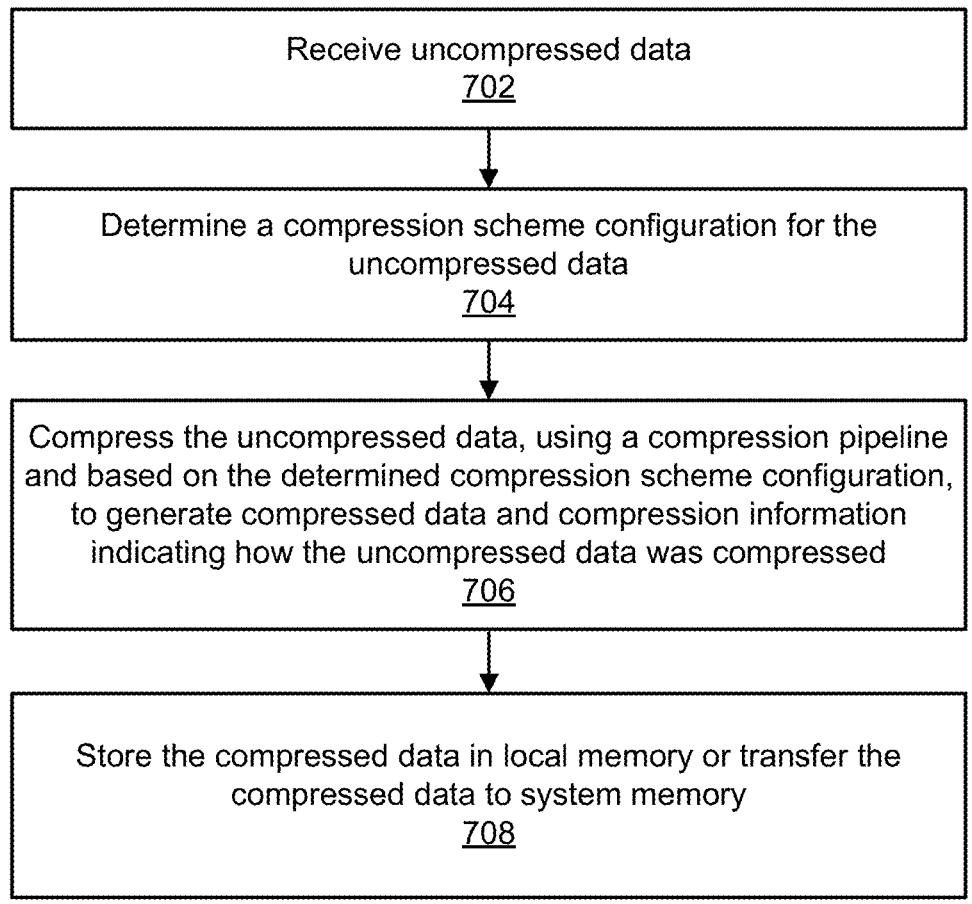
FIG. 7 illustrates an example process for compressing data, according to certain embodiments.

FIG. 7 is a flow diagram of an example process 700 for compressing data, according to certain embodiments. The process 700 can be performed at runtime by the compression unit 154 in FIG. 1. Alternatively, the process 700 can be performed offline by a software compiler that also generates program code for the NNA.

At block 702, uncompressed data is received. For example, if the process 700 is performed at runtime, the uncompressed data may be a set of activations that are the subject of a STORE instruction that stores the set of activations to the system memory. The uncompressed data may be received by a DME (e.g., DME 150). As another example, if the process 700 is performed offline, the data may be a set of weights determined based on training of the neural network.

At block 704, a compression scheme configuration is determined for the uncompressed data. The compression scheme configuration can include one or more compression schemes and, for each compression scheme, at least one compression parameter. In some embodiments, the determination of the compression scheme configuration is performed by the software compiler. In other embodiments, the determination of the compression scheme configuration is performed using an artificial intelligence model. For example, the decision on which compression schemes to include in the compression scheme configuration can be made by inputting the uncompressed data to another neural network that has been trained to infer which compression schemes to use and what their compression parameters (e.g., zero threshold or number of clusters) should be.

As mentioned earlier, selection of compression schemes can be based on various considerations such as performance of the compression scheme (e.g., a direct performance metric based on the total percent of compression, or an indirect performance metric based on the inference accuracy of the neural network as a result of using the compressed data). Another consideration mentioned earlier is the operating mode of the NNA (e.g., low power mode versus non-low power mode). Other performance related factors can also be taken into consideration.

In certain embodiments, the determination of whether to use zero value compression is based on the amount of compression provided by a zero value compression configuration under consideration. For example, multiple configurations, each involving a different zero threshold, can analyzed to determine their compression amounts. The range of permissible zero threshold values may vary depending on the values of the data itself (e.g., the range can be set based on the minimum and maximum values of the data). As a general rule, the amount of compression should be at least 20%. Thus, block 704 can include a step of comparing an amount of compression provided by a particular zero value compression configuration to a threshold compression amount corresponding to a minimum acceptable amount of compression. If a configuration does not meet or exceed the threshold compression amount, the zero threshold can be adjusted and the configuration reanalyzed to determine the amount of compression provided. The amount of compression depends on the values of the data being compressed. For example, if a four kilobyte weight block has 50% of its values being zero, then zero value compression would achieve 62.5% effective compression after discounting the overhead incurred as a result of having to store a CMAP for the four kilobyte block.

In certain embodiments, the determination of whether to use zero value compression (or any other type of compression) is based on the inference accuracy that results from executing the neural network using compressed data, e.g., data that has been compressed according to a zero value compression configuration under consideration. The inference accuracy can be determined based on average error of inferences produced as a result of executing the neural network on the compressed data. If the average error for a configuration under consideration does not meet or exceed a threshold value corresponding to a minimum acceptable level of accuracy, the configuration can be excluded from further consideration. Alternatively, a compression parameter (e.g., zero threshold) can be adjusted to reanalyze the configuration through executing the neural network to generate a new set of inferences using data compressed according to the new configuration (e.g., with the zero threshold adjusted), and then determining the accuracy level of the new set of inferences. For example, the zero threshold can be lowered in order to reduce the amount of compression while increasing accuracy. The following is an example in which both compression percentage and average error are taken into consideration.

Suppose that for a zero threshold of 0.03, the compression is 34%, and for a zero threshold of 0.04, the compression is 43%. Since both compression percentages exceed the 20% general rule mentioned above, either threshold could be acceptable. In a runtime setting, the threshold selection could be an arbitrary selection between these two thresholds. Alternatively, to save time, the first zero value threshold that results in at least 20% compression could be selected without calculating the compression percentage for any additional thresholds. In an offline setting, additional analysis could be performed to determine which of the two thresholds is better. For example, it may be that using the zero threshold of 0.04 would result in a significantly higher average error compared to using the zero threshold of 0.03. Still further analysis could be performed to determine whether any particular combination of compression schemes (e.g., zero value compression using a certain zero threshold in combination with shared value compression using a certain number of clusters) is better than other combinations. Thus, offline analysis may involve a more detailed study of the tradeoffs between different compression scheme configurations.

The determination of a shared value compression configuration can be performed in a similar manner (e.g., based on comparison between a mean error when using a first number of clusters and a mean error when using a second number of clusters).

At block 706, the uncompressed data received at block 702 is compressed, using a compression pipeline (e.g., the pipeline illustrated in FIG. 6), to generate compressed data based on the compression scheme configuration determined at block 704. In addition to the compressed data, compression information indicating how the uncompressed data was compressed is also generated. The compression information may identify each compression parameter used to compress the uncompressed data at block 706. For example, if zero value compression was selected in block 704, the compression information may include a CMAP. If shared value compression was selected in block 704, the compression information may indicate the number of clusters used to encode the data, and may further indicate the value of each cluster.

At block 708, the compressed data is stored. The compressed data can be stored in the local memory of the NNA (e.g., one of the local memory buffers 140) or transferred to the system memory for storage.

Figure 8:
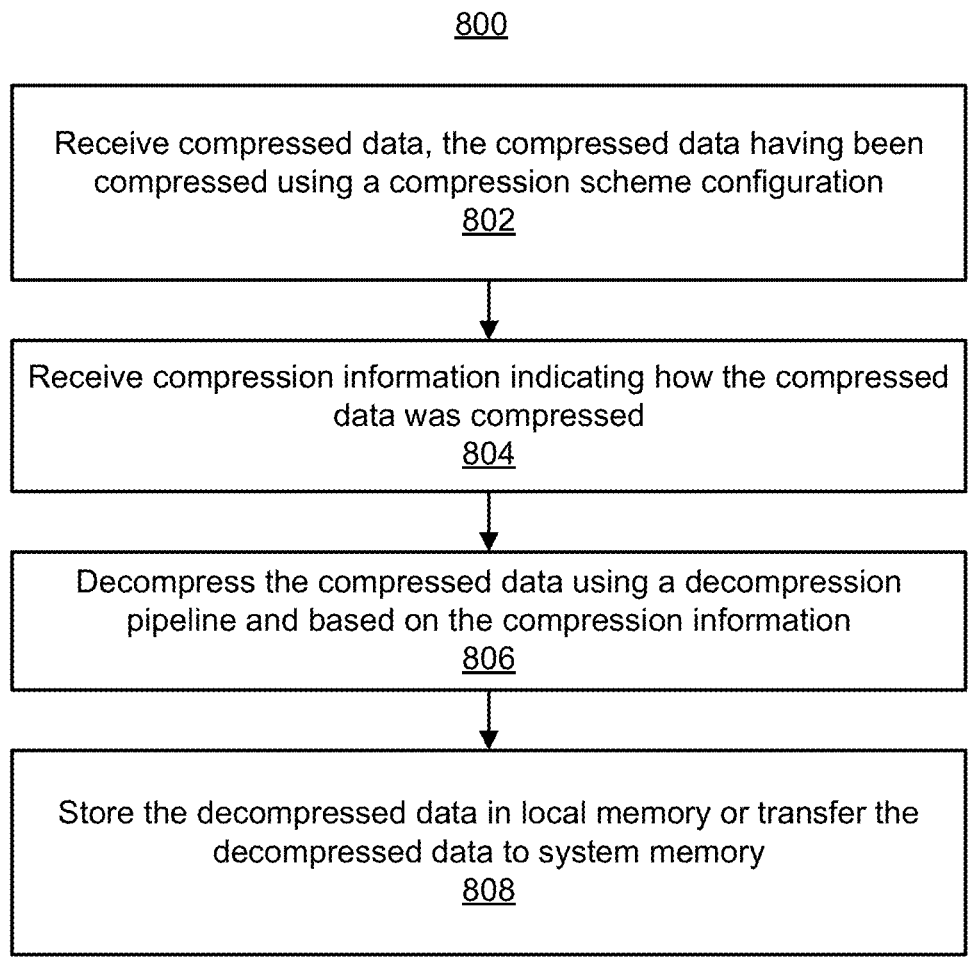
FIG. 8 illustrates an example process for decompressing data, according to certain embodiments.

FIG. 8 is a flow diagram of an example process 800 for decompressing data, according to certain embodiments. The process 800 can be performed at runtime by the decompression unit 152 in FIG. 1. Alternatively, the process 800 can be performed by a host processor. When performed by the host processor, the decompression at block 806 can occur during runtime or offline.

At block 802, compressed data is received (e.g., by the DME 150 or the host processor). The compressed data is data that has been compressed using a compression scheme configuration. As explained in connection with the process 700 in FIG. 7, a compression scheme configuration can include one or more compression schemes and, for each compression scheme, at least one compression parameter.

At block 804, compression information is received. The compression information indicates how the compressed data was compressed. For example, if zero value compression was used to generate the compressed data received at block 802, the compression information may include a CMAP. If shared value compression was used to generate the compressed data at block 802, the compression information may indicate the number of clusters used to encode the data, and may further indicate the value of each cluster.

At block 806, the compressed data is decompressed using a decompression pipeline and based on the compression information received in block 804. For example, if the compression scheme configuration includes both zero value compression and shared value compression, the decompression pipeline can perform zero value decompression to generate partially decompressed data, and then perform shared value decompression on the partially decompressed data to generate fully decompressed data.

At block 808, the decompressed data generated at block 806 is stored in local memory or transferred to system memory. Alternatively, the decompressed data can be input to a processing component for use in a computation. For example, as mentioned earlier, in some embodiments a local memory buffer may store compressed data, with the compressed data being read out of the local memory buffer and into a decompression unit configured to provide the decompressed data to an NPU.

Figure 9:
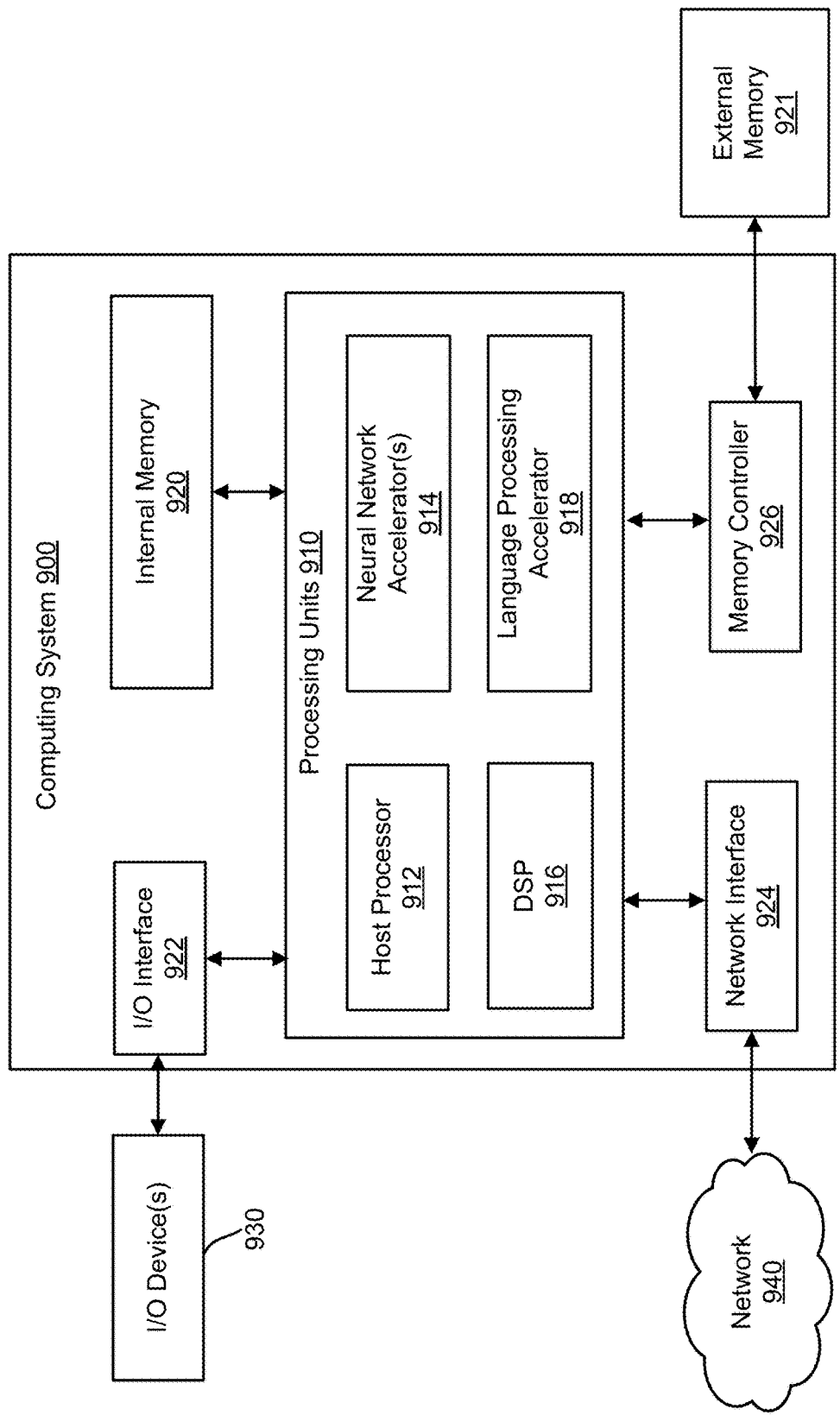
FIG. 9 illustrates an example of a computing system in which the neural network accelerator of FIG. 1 can be used.

FIG. 9 is a simplified block diagram of an example computing system 900 in which the NNA 100 of FIG. 1 can be used. In some examples, the computing system 900 can be used to implement a special purpose computing system for executing neural networks in connection with specific types of applications. For example, the computing system 900 may implement a computing device that processes speech input through NNA 100 to provide an intelligent virtual assistant that performs various tasks on behalf of a user, such as home automation, playing audio or visual media, and placing online orders for products or services. Alternatively, the computing system 900 can be used to implement a general purpose computer that also has neural network capabilities. In certain embodiments, the computing system 900 is implemented as a system-on-chip (SoC).

The example computing system 900 of FIG. 9 includes a set of processing units 910, an internal memory 920, an external memory 921, an Input/Output (I/O) interface 922, and a network interface 924. The processing units 910 can include a host processor 912, an NNA 914, a digital signal processor (DSP) 916, a language processing accelerator 918, and a memory controller 926. The computing system 900 can further include one or more busses (not depicted) that enable the various components of the computing system 900 to communicate with one another. In various implementations, the computing system 900 can include other hardware that is not illustrated here.

The host processor 912 can be a general purpose integrated circuit that is capable of executing program instructions. In some examples, the host processor 912 can include multiple processing cores. In a multi-core processor, each core may be able to independently execute program code. As part of executing its own program code, the host processor 912 may generate program code (e.g., an NNA context) for execution on NNA 914. For example, host processor 912 may execute a software compiler stored in the internal memory 920 or the external memory 921 to produce compiled program code and device driver code for transmission to NNA 914. In certain embodiments, the computing system 900 can include more than one host processor 912, each host processor being capable of acting as the host for NNA 914.

The NNA 914 can be implemented using the NNA 100 in FIG. 1 and is configured to execute contexts on behalf of the host processor 912. The processing units 910 can include multiple NNAs 914 configurable to run contexts simultaneously, e.g., contexts for different portions of the same neural network or for different neural networks.

The DSP 916 can perform digital signal processing to prepare data for processing by other processing units such as the NNA 914 or the language processing accelerator 918. In some embodiments, the DSP 916 may condition and convert analog audio signals into digital data, where the audio signals are generated by one or more microphones included in I/O devices 930.

The language processing accelerator 918 can perform language processing including, for example, speech recognition. In certain embodiments, the language processing accelerator 918 implements a Weighted Finite-State Transducers (WFST) based language model for speech recognition. However, the language processing accelerator 918 can also implement other language models in addition, or as an alternative, to the WFST based language model. The language processing accelerator 918 can work in conjunction with the NNA 914 and the DSP 916 to perform language processing. For example, an audio frame from a microphone may be processed by DSP 916 to extract audio features (e.g., using a Fast Fourier Transform or other signal analysis techniques) in the form of a feature vector for input to an acoustic model. The acoustic model may be implemented by a neural network executed within the NNA 914, and may infer the probability that the audio frame corresponds to particular words or parts of speech (e.g., one or more phonemes). The probabilities computed by the acoustic model can then be input to the language processing accelerator 918 to decode the audio frame into text.

The internal memory 920 and the external memory 921 collectively form the system memory of the computing system 900. The system memory can include memory used for storage of program code executed by the host processor 912, the NNA 914, and/or any of the other processing units 910. For example, the system memory can include an operating system, software applications executed by the host processor 912 within an environment provided by the operating system, device driver code (e.g., for configuring an NNA context, selecting a memory buffer configuration, or for controlling the I/O devices 930), program code for an NNA context, storage space for data being operated on or produced by the host processor 912, storage space for activations and weights for loading into the NNA 914, storage space for results computed by NNA 914, and storage space for data being operated on or produced by the language processing accelerator 918. The operating system within the system memory can coordinate the activities of the hardware of the computing system 900, as well as the activities of any software applications or device drivers. For example, the operating system can perform operations such as scheduling NNA contexts, executing applications, or controlling peripheral devices (e.g., the I/O devices 930). The system memory can be implemented using volatile memory types (such as Random Access Memory (RAM) type memories) and/or non-volatile memory types (such as Read-Only Memory (ROM), flash memory, etc.).

The above described data of the system memory can be distributed between the internal memory 920 and the external memory 921 in any fashion. For example, the internal memory 920 may store the operating system, device driver code, program code for an NNA context, and software applications, while the external memory 921 stores activations, weights, and results computed by the NNA 914. In some embodiments, both the internal memory 920 and the external memory 921 may store data used by the NNA 914.

The memory controller 926 is configured to transfer data between the external memory 921 and the processing units 910. For example, if the data coming into the DME 150 of FIG. 1 is provided by the external memory 921, the memory controller 926 may read the data out of the external memory 921 and into the DME 150. In certain embodiments, the external memory 921 is implemented as Dynamic Random Access Memory (DRAM), and the memory controller 926 is a DRAM controller. However, the external memory 921 can be implemented with other types of memory besides DRAM, e.g., flash memory, SRAM, etc.

The I/O devices 930 can include hardware that adds functionality to the computing system 900. For example, the I/O devices 938 can include non-volatile storage devices, such as solid state drives, magnetic drives, optical drives, and/or tape drives, among other examples. The I/O devices 930 can further include devices for receiving input from or providing output to a user, such as keyboards, display monitors, audio speakers, and microphones.

The network interface 924 can enable the computing system 900 to communicate with a network 940 or with multiple networks. The network interface 924 can include, for example, one or more network interface cards (NICs). The network interface 924 can include a physical port for connecting to a wired network. Alternatively or additionally, the network interface 924 can include an antenna for connecting to a wireless network. In some examples, the network interface 924 includes more than one physical port, and/or more than one antenna, so that the computing system 900 can communicate with multiple networks at the same time.

The system memory (internal memory 920 and external memory 921), storage devices, and other memories discussed above are examples of computer-readable media. Other examples of computer-readable media include removable storage devices, such as magnetic tapes, floppy disks, Compact Discs (CDs), Digital Versatile Discs (DVDs), Blue-Ray disks, and flash memory drives, among other examples. In each of these examples, the computer-readable medium is capable of storing program code that can be executed by one or more of the processing units 910. In some cases, the computer-readable medium may be non-transitory, meaning that the data stored on the computer-readable medium remains stored on the medium when power is not applied to the computer readable medium. Examples of non-transitory computer-readable media include ROM-based memory, hard disks, removable disks such as those listed above, and flash-based memory, among other examples.

Although specific embodiments have been described, various modifications, alterations, alternative constructions, and equivalents are possible. Various features and aspects of the above-described embodiments may be used individually or jointly. The specification and drawings are, accordingly, to be regarded in an illustrative rather than a restrictive sense. It will, however, be evident that various modifications and changes may be made thereunto without departing from the broader spirit and scope of the disclosure as set forth in the claims. Further, while certain embodiments have been described using a particular combination of hardware and software, it should be recognized that other combinations of hardware and software are also possible.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various embodiments of this disclosure are described herein. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system, comprising:
   a processor comprising:
   a memory;
   a processing unit; and
   one or more decompression units operable to perform decompression in accordance with a compression scheme, wherein the one or more decompression units are configured to:
   receive compressed data and compression information;
   generate decompressed data by decompressing the compressed data using the compression information; and
   send the decompressed data to the memory or the processing unit;
   wherein the memory is configured to store the compressed data prior to decompression of the compressed data or to store the decompressed data.

2. The computing system of claim 1, further comprising:
a host processor configured to generate the compressed data by compressing a set of data according to the compression scheme.

3. The computing system of claim 2, wherein to generate the compressed data, the host processor:
determines a range around zero, wherein removal of values from the set of data that fall within the range results in a threshold amount of compression or a threshold level of accuracy; and
removes a value from the set of data, wherein the value is within the range.

4. The computing system of claim 2, wherein the compression information includes a compression map that indicates a position, within the set of data, of a value that is not included in the compressed data, and wherein to generate the decompressed data, the one or more decompression units:
identify the position of the value based on the compression map; and
replace the value with a zero.

5. The computing system of claim 2, wherein the compression information includes a binary bit-map, the binary bit-map comprising a plurality of bits, each bit of the plurality of bits representing a different position within the set of data, and wherein the plurality of bits includes a bit indicating that the compressed data was generated by removing, from the set of data, a value at a position represented by the bit.

6. The computing system of claim 2, wherein to generate the compressed data, the host processor:
assigns a first value from the set of data and a second value from the set of data to a first cluster in a group of clusters based on proximity of the first value and the second value to a third value associated with the first cluster, the proximity being indicated by a first difference between the first value and the third value and a second difference between the second value and the third value, wherein each cluster in the group of clusters represents a different value, and wherein the first value and the second value differ from each other in addition to differing from the third value;
substitutes an index of the first cluster for the first value, wherein the index identifies the first cluster; and
substitutes the index of the first cluster for the second value.

7. The computing system of claim 6, wherein the host processor assigns the first value and the second value to the first cluster by minimizing a cost function, wherein the cost function is a function of the first difference between the first value and the third value, and the second difference between the second value and the third value.

8. The computing system of claim 1, wherein the processor is a neural network processor configured to execute a neural network, wherein the processing unit generates inferences using the decompressed data, wherein the decompressed data comprises a value representing a weight of the neural network, and wherein the processing unit generates an inference by multiplying the value representing the weight of the neural network by a value representing an activation of the neural network.

9. The computing system of claim 1, wherein the one or more decompression units include:
a first decompression unit operable to generate the decompressed data; and
a second decompression unit configured to receive the decompressed data from the first decompression unit and send the decompressed data to the memory or the processing unit.

10. The computing system of claim 9, further comprising:
a data move engine that executes a load instruction by transferring the compressed data to the first decompression unit, wherein, based on compression mode information, the data move engine:
instructs the first decompression unit to generate the decompressed data; and
instructs the second decompression unit to send the decompressed data to the memory.

11. A method performed by a computing system, the method comprising:
receiving, by one or more decompression units of a processor of the computing system, compressed data and compression information;
generating, by the one or more decompression units, decompressed data by decompressing the compressed data using the compression information in accordance with a compression scheme;
sending, by the one or more decompression units, the decompressed data to a memory of the processor or to a processing unit of the processor; and
storing the compressed data at the memory prior to decompression of the compressed data or storing the decompressed data at the memory.

12. The method of claim 11, further comprising:
generating, by a host processor of the computing system, the compressed data by compressing a set of data according to the compression scheme.

13. The method of claim 11, wherein the processor is a neural network processor configured to execute a neural network, wherein the processing unit generates inferences using the decompressed data, wherein the decompressed data comprises a value representing a weight of the neural network, and wherein the processing unit generates an inference by multiplying the value representing the weight of the neural network by a value representing an activation of the neural network.

14. The method of claim 11, wherein the one or more decompression units include:
a first decompression unit for generating the decompressed data; and
a second decompression unit for receiving the decompressed data from the first decompression unit and sending the decompressed data to the memory or the processing unit.

15. The method of claim 14, wherein the computing system includes a data move engine that executes a load instruction by transferring the compressed data to the first decompression unit, wherein the method further comprises:
instructing, by the data move engine and based on compression mode information, the first decompression unit to generate the decompressed data; and
instructing, by the data move engine and based on the compression mode information, the second decompression unit to send the decompressed data to the memory.

16. A processor, comprising:
a memory;
a processing unit; and
one or more decompression units operable to perform decompression in accordance with a compression scheme, wherein the one or more decompression units are configured to:

receive compressed data and compression information;

generate decompressed data by decompressing the compressed data using the compression information; and send the decompressed data to the memory or the processing unit;

wherein the memory is configured to store the compressed data prior to decompression of the compressed data or to store the decompressed data.

17. The processor of claim 16, wherein a host processor separate from the processor is configured to generate the compressed data by compressing a set of data according to the compression scheme.

18. The processor of claim 16, wherein the processor is a neural network processor configured to execute a neural network, wherein the processing unit generates inferences using the decompressed data, wherein the decompressed data comprises a value representing a weight of the neural network, and wherein the processing unit generates an inference by multiplying the value representing the weight of the neural network by a value representing an activation of the neural network.

19. The processor of claim 16, wherein the one or more decompression units include:

a first decompression unit operable to generate the decompressed data; and a second decompression unit configured to receive the decompressed data from the first decompression unit and send the decompressed data to the memory or the processing unit.

20. The processor of claim 19, further comprising:

a data move engine that executes a load instruction by transferring the compressed data to the first decompression unit, wherein, based on compression mode information, the data move engine:

instructs the first decompression unit to generate the decompressed data; and instructs the second decompression unit to send the decompressed data to the memory.

\* \* \* \* \*